United States Patent [19]

Kolodin

[11] Patent Number: 4,573,033
[45] Date of Patent: Feb. 25, 1986

[54] FILTER CIRCUIT FOR DIGITAL-TO-ANALOG CONVERTER

[75] Inventor: Louis Kolodin, Cherry Hill, N.J.

[73] Assignee: RCA Corporation, Princeton, N.J.

[21] Appl. No.: 514,952

[22] Filed: Jul. 18, 1983

[51] Int. Cl.[4] .................................................. H03K 13/02
[52] U.S. Cl. .......................... 340/347 DA; 328/127;
328/142; 328/151; 340/347 SH; 364/853
[58] Field of Search ................ 340/347 DA, 347 SH;
328/13, 14, 142, 127, 151; 364/853

[56] References Cited

U.S. PATENT DOCUMENTS

| | | | |
|---|---|---|---|
| 3,639,848 | 2/1972 | Elliott | 328/167 |
| 3,649,825 | 3/1972 | Burrage | 364/853 |
| 3,707,713 | 12/1972 | Diaz et al. | 340/347 |
| 3,754,233 | 8/1973 | Sutherland | 340/347 |
| 3,824,382 | 7/1974 | Eshelman | 364/853 |
| 4,390,844 | 6/1983 | Ting | 328/151 |
| 4,404,546 | 9/1983 | Hata et al. | 340/347 DA |

OTHER PUBLICATIONS

"Analog-Digital Conversion Handbook", D. H. Sheingold, ed., Analog Devices Inc., Norwood, Mass., 1972, pp. I-50, 1-99 through 1-100.

Primary Examiner—Clifford C. Shaw
Attorney, Agent, or Firm—Joseph S. Tripoli; Robert L. Troike; Christopher L. Maginniss

[57] ABSTRACT

A filter circuit smooths the output signal of a digital-to-analog converter by providing linear ramps between adjacent steps of the signal. The circuit measures the voltage difference between two adjacent step levels, amplifies the difference voltage by a predetermined gain, 10 in the present example, then applies the amplified signal to an integrating network having a time constant which is determined by the amplifier gain and the sampling time of the D/A converter. The integrator output signal is summed over the sample period with the converter output signal level of the next preceding sample time period, thereby providing a waveform which has substantially linear transitions between adjacent D/A output levels.

24 Claims, 1 Drawing Figure

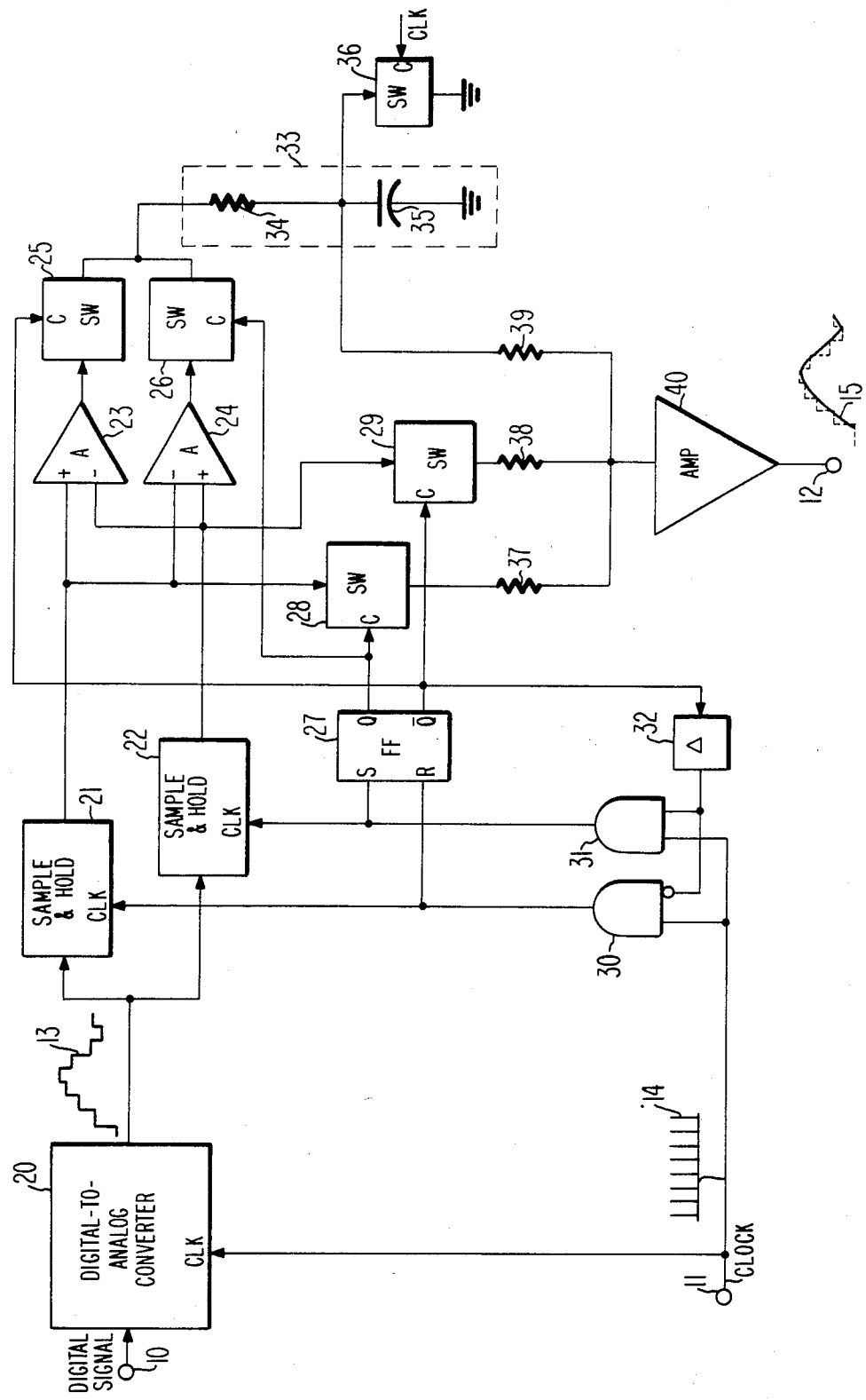

FILTER CIRCUIT FOR DIGITAL-TO-ANALOG CONVERTER

This invention relates to digital-to-analog (D/A) converters and, more particularly, to a filter circuit which smooths the output signal of a D/A converter.

The output signal of a typical D/A converter comprises a sequence of voltage levels having equal time durations. Although the overall shape of this signal resembles the desired analog signal, the abrupt step transitions between the voltage levels contain very high frequency components which can introduce noise problems into the circuitry which responds to the converter output.

It is known to filter the output signal of a D/A converter. U.S. Pat. No. 3,707,713, issued Dec. 26, 1972, to Diaz et al., and U.S. Pat. No. 3,754,233, issued Aug. 21, 1973, to Sutherland, both disclose low pass filtering to average the output signal of pulse rate or pulse width modulated signals.

The Analog-Digital Conversion Handbook, D. H. Sheingold, ed., Analog Devices, Inc., Norwood, Mass. 1972, at p. I-50, discusses a D/A converter having an output signal comprising discrete steps between constant voltage levels, and suggests integrating the voltage differences between adjacent values so that the discontinuities become changes in slope rather than steps. However, such changes in slope lack linearity and the integrator performance is limited by the values chosen for its components.

It is the object of the present invention to provide a filter circuit for use with a D/A converter which filter brings about substantially linear transitions between the voltage levels generated by the converter.

In accordance with the principles of the present invention, a filter circuit is disclosed for use with a signal generator. The filter comprises means for sampling the generator output signal, means for amplifying the differential voltage of two consecutive samples of generator output signal, and means for integrating the signal provided by the amplifying means. The filter additionally includes means for combining the output signal of the integrating means with the earlier of the two consecutive samples of generator output signal.

Other features and advantages of the present invention will be more fully understood from the following detailed description of the preferred embodiment, the appended claims, and the accompanying drawing, in which:

the sole FIGURE is a schematic representation of the preferred embodiment.

Referring to the FIGURE, a digital signal, applied at input terminal 10, is coupled to the signal input port of digital-to-analog (D/A) converter 20. A clock signal 14, applied at input terminal 11, is coupled to the clock input port (CLK) of converter 20. Converter 20 is of the type, well known in the art, which converts a digital input signal to an equivalent voltage level upon each occurrence of a clocking signal. Clock signal 14 consists of narrow, equally spaced pulses which, in the present example of a speech processing system, may occur at a frequency of 8 KHz.

The signal 13 appearing at the output terminal of converter 20, in response to the digital input signal, comprises a sequence of discrete voltage levels of equal time duration. Signal 13 is applied to the input terminals of sample and hold circuit 21 and 22. Gates 3 and 31 provide the clock (CLK) inut signals to circuits 21 and 22, respectively. Sample and hold circuits 21 and 22 may be of a type well known in the art, such as an FET or integrated circuit transmission gate switch which momentarily turns on, enabling a signal to charge a capacitor, then turns off, trapping the charge on the capacitor.

The network of digital logic elements comprising flip-flop 27, gates 30 and 31, and delay circuit 32 provides signals responsive to alternate pulses of clock signal 14. When flip-flip 27 is reset, that is, the voltage level at its Q output terminal is relatively low and the voltage level at its $\overline{Q}$ output terminal is relatively high, the voltage level at the $\overline{Q}$ output terminal, applied via delay circuit 32 to one input terminal of gate 31 and to the inverting input terminal of gate 30, enables gate 31 to respond to clock signal 14 applied to its other input terminal. Similarly, when flip-flop 27 is set, that is, the signal at its $\overline{Q}$ output terminal is low, gate 30 is enabled to pass clock signal 14 and gate 31 is disabled. Because each output pulse of gate 31 causes flip-flop 27 to set, and each output pulse of gate 30 causes flip-flop 27 to reset, gates 30 and 31 enable sample and hold circuits 21 and 22, respectively, on alternate occurrences of pulses of clock signal 14, and cause flip-flop 27 to change state on each of these clock pulses. Delay element 32, which may comprise a one-shot circuit, delays the effect of the change of state of flip-flop 27 on the enable inputs of gates 30 and 31 until the pulse of clock signal 14 has terminated.

The signal at the output terminal of sample and hold circuit 21 is applied to the non-inverting (+) input terminal of differential-input amplifier 23 and to the inverting (−) input terminal of differential-input amplifier 24. In like manner, the signal at the output terminal of sample and hold circuit 22 is applied to the inverting input terminal of amplifier 23 and to the non-inverting input terminal of amplifier 24. Amplifiers 23 and 24 are identical and may be, for example, similar to type LM148 operational amplifiers sold by National Semiconductor Corp., Santa Clara, Calif.

The signal at the output terminal of amplifier 23 is applied to the input terminal of switch 25, which is coupled at its control (C) input terminal to the $\overline{Q}$ output terminal of flip-flop 27. In a similar manner, the signal at the output terminal of amplifier 24 is applied to the input terminal of switch 26, which is coupled at its control (C) input terminal to the Q output terminal of flip-flop 27. Switches 25 and 26 may be, for example, FETs or integrated circuit transmission gates such as type CD4066B sold by RCA Corp., Somerville, N.J.

The signals at the output terminals of switches 25 and 26 are combined and coupled to integrator 33, which comprises series-connected resistor 34 and capacitor 35, which is coupled between ground and the terminal of resistor 34 remote from switches 25 and 26. Switch 36, coupled across capacitor 35 and responsive to the pulses of clock signal 14 applied to its control (C) input terminal, has the effect of draining the charge stored across capacitor 35 during each clock pulse.

Switch 28 responds to the Q output signal of flip-flop 27 applied at its control (C) input terminal to enable the output signal of sample and hold circuit 21 to amplifier 40 via summing resistor 37. Similarly, switch 29 responds to the $\overline{Q}$ output signal of flip-flop 27 applied at its control (C) input terminal to enable the output signal of sample and hold circuit 22 to amplifier 40 via summing resistor 38. Finally, the output signal of integrator 33 is applied to amplifier 40 via summing resistor 39. Switches 28, 29 and 36 may be, for example, similar to the types suggested for use as switches 25 and 26. Amplifier 40 may be, for example, similar to type RM4156 operational amplifier sold by Raytheon Co., Semiconductor Division, Mountain View, Calif. Amplifier 40 responds to the three input signals received through resistors 37, 38 and 39 to produce an output signal 15 which is applied to output terminal 12.

The operation of the circuit of the FIGURE may be described as follows. A sequence of voltage levels which comprise signal 13 are clocked out of digital-to-analog converter 20 in correspondence with clock signal 14. Flip-flop 27, gates 30 and 31, and delay circuit 32 combine to cause the voltage levels of signal 13 to be alternately stored in sample and hold circuits 21 and 22.

The signals stored by sample and hold circuits 21 and 22 are combined in amplifiers 23 and 24 in the following manner: with the present voltage level of signal 13 clocked into circuit 21 by gate 30, amplifier 23 amplifies the voltage difference between the present voltage level of signal 13, stored in circuit 21, and the next preceding voltage level of signal 13, stored in circuit 22. If the present voltage level of signal 13 is greater (more positive) than the next preceding voltage level of signal 13, then the voltage output of amplifier 23 is positive. If, however, the present voltage level (stored in circuit 21) is less than the next preceding voltage level of signal 13 (stored in circuit 22), then the voltage output of amplifier 23 is negative.

Following the next clock pulse, the present voltage level of signal 13 is stored in sample and hold circuit 22, while the level stored in circuit 21 becomes the next preceding voltage level. In this case, amplifier 24 provides a positive output signal level when the present voltage level (stored in circuit 22) is greater than the next preceding voltage level (stored in circuit 21), and the negative output signal when the present voltage level is less than the next preceding voltage level.

Both amplifiers 23 and 24 provide a predetermined and substantially equal gain to the difference voltages impressed across their respective input terminals which, in the present example, is ten. As will be seen in an upcoming discussion, the value of amplifier gain is related to the time constant of integrator 33.

Switch 25 is opened to pass the output signal of amplifier 23 only when flip-flop 27 is reset, that is, while amplifier 23 is providing an output signal corresponding to the change in voltage level of signal 13 from the next preceding level stored in circuit 22 and the present level stored in circuit 21. Similarly, switch 26 is opened to pass the output signal of amplifier 24 only when flip-flop 27 is set, that is, while amplifier 24 is providing an output signal corresponding to the change in voltage level of signal 13 from the next preceding level stored in circuit 21 and the present level stored in circuit 22.

The combined outputs of switches 25 and 26 are applied to integrator 33. It is the object of integrator 33 to provide a ramp signal which rises (or falls) linearly to a voltage level which is the difference between two adjacent voltage levels of signal 13 over time period $t_d$, which is the time duration between pulses of clock signal 14. The generalized formula for an integrator output signal, having time constant T and responding to a step input voltage $V_o$, is given by $$V(t) = V_o (1 - e^{-t/T}). \tag{1}$$

In the present case, the ramp signal value at time $t = t_d$ is the difference voltage $V_d$, and the step voltage is the difference voltage multiplied by the gain of the amplifier, A. Replacing these values in Equation (1) gives $$V_d = A \cdot V_d (1 - e^{-t_d/T}). \tag{2}$$

Solving for T gives $$T = t_d / \ln [A/(A-1)]. \tag{3}$$

In the present example, with A = 10 and $t_d = 0.125$ milliseconds, $$RC = T = 1.186 \text{ milliseconds},$$

and typical values for resistor 34 and capacitor 35 may be, for example, Resistor 34—12.0 kilohms and
Capacitor 35—0.10 microfarad.

Using these values, it is seen that $t_d$ represents approximately one-tenth of the time constant T. It is well known that an RC integrator behaves substantially linearly over its first one-tenth time constant. Therefore, the combination of amplifiers 23 and 24 and integrator 33 provides a means for generating ramp signals which rise (or fall) linearly to the level of the difference voltage during time period $t_d$.

Integrator 33 is initialized to a zero voltage level across capacitor 35 at the onset of each period of clock signal 14 by the operation of switch 36, which provides a short circuit to ground during each pulse of signal 14.

Depending upon the state of flip-flop 27, the signal output of integrator 33 is summed, via resistor 39, with either the voltage level in sample and hold circuit 21, via resistor 37, or the voltage level in circuit 22, via resistor 38. When the present voltage of signal 13 is stored in circuit 21, and the next preceding voltage level is stored in circuit 22, switches 25 and 29 are activated, summing the voltage level in sample and hold circuit 22 with the substantially linear ramp signal of integrator 33 which goes from zero volts to the difference voltage between the levels stored in circuits 21 and 22. Similarly, when the present voltage of signal 13 is stored in circuit 22, and the next preceding voltage level is stored in circuit 21, switches 26 and 28 are activated, summing the voltage level in circuit 21 with the substantially linear ramp signal of integrator 33.

The result of these operations is signal 15 at the output terminal of amplifier 40 which resembles signal 13, but which has substantially linear transitions between the steps of signal 13. These substantially linear segments form a signal 15 which is virtually free of high frequency components.

The gain value of ten for amplifiers 23 and 24, as used in the present example, was chosen as a convenient value, providing good ramp linearity, while not requiring an excessive voltage swing at the amplifier outputs. Nevertheless, this value does not limit the invention; any appropriate value of gain, with a corresponding value of integrator time constant, may be chosen.

Other embodiments of the present invention will be apparent to those skilled in the art to which it pertains. The scope of this invention is not intended to be limited to the embodiment disclosed herein but should instead by gauged by the breadth of the claims which follow.

What is claimed is:

1. A filter for use with a signal generator, said filter comprising:
   means for sampling the output signal of said generator;
   means for amplifying the differential voltage of two consecutive samples of said generator output signal, said amplifying means having gain substantially greater than unity;
   means for integrating the signal provided by said amplifying means, said integrating means having a time constant substantially greater than the time duration between said two consecutive samples; and
   means for combining the output signal of said integrating means with the voltage level of the earlier of said two consecutive samples of said generator output signal.

2. The apparatus according to claim 1 wherein said integrating means time constant T is related to said time duration, $t_d$, between said two consecutive samples and said gain, A, of said amplifying means according to $$T = t_d / \ln [A/(A-1)].$$

3. A filter for use with a digital-to-analog (D/A) converter, wherein said D/A converter provides an output signal comprising a succession of voltage levels with each voltage level occurring in a corresponding time period, said filter comprising:
   means responsive to said converter output signal for amplifying a voltage which is the difference between said converter output signal voltage level occurring during one time period and the voltage level of said converter output signal of the next preceding time period, said amplifying means having gain substantially greater than unity;
   means for integrating the output signal of said amplifying means, said integrating means having a time constant substantially greater than the time duration between said one time period and said next preceding time period; and
   means for summing the output signal of said integrating means with the voltage level of said converter output signal of said next preceding time period.

4. The apparatus according to claim 3 further including means for periodically sampling said converter output signal and means for storing a voltage corresponding to the level of said converter output signal at the time of said sampling.

5. The apparatus according to claim 4 further including terminal means for receiving a sampling clock signal and means for coupling said clock signal to said sampling means.

6. The apparatus according to claim 5 wherein said sampling means and said storing means include two sample and hold circuits, each of said circuits responsive to alternate pulses of said clock signal.

7. The apparatus according to claim 6 wherein said amplifying means includes a differential-input amplifier coupled at its positive (+) input terminal to a first of said sample and hold circuits and at its negative (−) input terminal to a second of said sample and hold circuits.

8. The apparatus according to claim 7 wherein said amplifying means further includes a second differential-input amplifier coupled at its (+) input terminal to said second sample and hold circuit and at its (−) input terminal to said first sample and hold circuit.

9. The apparatus according to claim 8 further including two switch means coupled individually to the output terminals of said two differential-input amlifiers, wherein said switch means are individually enabled when the sample and hold circuit coupled to the (+) input terminal of the corresponding amplifier contains the more current sample of said converter output signal.

10. The apparatus according to claim 3 wherein said integrating means time constant T is related to said time duration, $t_d$, between said one time period and said next preceding time period and said gain, A, of said amplifying means according to $$T = t_d / \ln [A/(A-1)].$$

11. The apparatus according to claim 10 wherein said integrating means includes a resistor having resistance R and a capacitor having capacitance C, and wherein T=RC.

12. The apparatus according to claim 1 wherein said integrating means further includes means for discharging the potential across said capacitor at the onset of each sampling period.

13. The apparatus according to claim 12 wherein said discharging means includes a switch coupled across said capacitor, said switch responsive at a control input terminal to said sampling clock signal.

14. A digital-to-analog signal conversion system comprising:
   a digital-to-analog (D/A) converter providing an output signal comprising a succession of voltage levels with each voltage level occurring in a corresponding time period;
   means responsive to said converter output signal for amplifying a voltage which is the difference between said converter output signal voltage level occurring during one time period and the voltage level of said converter output signal of the next preceding time period, the gain of said amplifying means being substantially greater than unity;
   means for integrating the output signal of said amplifying means, said integrating means having a time constant which is related to said gain of said amplifying means and the duration of said time period, said time constant being substantially greater than the time duration of said time period; and
   means for summing the output signal of said integrating means with the voltage level of said converter output signal of said next preceding time period.

15. The apparatus according to claim 14 further including means for periodically sampling said converter output signal and means for storing a voltage corresponding to the level of said converter output signal at the time of said sampling.

16. The apparatus according to claim 15 further including terminal means for receiving a sampling clock signal and means for coupling said clock signal to said sampling means.

17. The apparatus according to claim 16 wherein said sampling means and said storing means include two sample and hold circuits, each of said circuits responsive to alternate pulses of said clock signal.

18. The apparatus according to claim 17 wherein said amplifying means includes a differential-input amplifier coupled at its positive (+) input terminal to a first of said sample and hold circuits and at its negative (−) input terminal to a second of said sample and hold circuits.

19. The apparatus according to claim 18 wherein said amplifying means further includes a second differential-input amplifier coupled at its (+) input terminal to said second sample and hold circuit and at its (−) input terminal to said first sample and hold circuit.

20. The apparatus according to claim 19 further including two switch means coupled individually to the output terminals of said two differential-input amplifiers, wherein said switch means are individually enabled when the sample and hold circuit coupled to the (+) input terminal of the corresponding amplifier contains the more current sample of said converter signal.

21. The apparatus according to claim 14 wherein said integrating means time constant T is related to the duration, $t_d$, of said time period and said gain, A, of said amplifying means according to $$T = t_d / \ln [A/(A-1)].$$

22. The apparatus according to claim 21 wherein said integrating means includes a resistor having resistance R and a capacitor having capacitance C, and wherein T=RC.

23. The apparatus according to claim 22 wherein said integrating means further includes means for discharging the potential across said capacitor at the onset of each sampling period.

24. The apparatus according to claim 23 wherein said discharging means includes a switch coupled across said capacitor, said switch responsive at a control input terminal to said sampling clock signal.

* * * * *